(12) United States Patent
Nakata et al.

(10) Patent No.: US 10,243,013 B2
(45) Date of Patent: Mar. 26, 2019

(54) IMAGING APPARATUS (71) Applicant: KYOCERA Corporation, Kyoto (JP)

(72) Inventors: Takatoshi Nakata, Yokohama (JP); Makoto Suzuki, Yokohama (JP); Takahiro Okada, Yokohama (JP)

(73) Assignee: KYOCERA Corporation, Kyoto (JP)

(*) Notice: Subject to any disclaimer, the term of this patent is extended or adjusted under 35 U.S.C. 154(b) by 0 days.

(21) Appl. No.: 15/514,156

(22) PCT Filed: Sep. 25, 2015

(86) PCT No.: PCT/JP2015/004895
§ 371 (c)(1),
(2) Date: Mar. 24, 2017

(87) PCT Pub. No.: WO2016/047151
PCT Pub. Date: Mar. 31, 2016

(65) Prior Publication Data
US 2017/0301711 A1 Oct. 19, 2017

(30) Foreign Application Priority Data
Sep. 26, 2014 (JP) ................ 2014-197530

(51) Int. Cl.
H01L 27/146 (2006.01)
G03B 17/02 (2006.01)
(Continued)

(52) U.S. Cl.
CPC ........ *H01L 27/14618* (2013.01); *G02B 7/004* (2013.01); *G03B 17/02* (2013.01);
(Continued)

(58) Field of Classification Search
CPC ...... H01L 23/32; H01L 25/041; H01L 25/042
See application file for complete search history.

(56) References Cited

U.S. PATENT DOCUMENTS 5,153,734 A * 10/1992 Kanamori ............... H01L 23/32
257/E31.118
6,933,584 B2 8/2005 Miyazaki et al.
(Continued)

FOREIGN PATENT DOCUMENTS

JP S61-259599 A 11/1986
JP 2003-086779 A 3/2003
(Continued)

OTHER PUBLICATIONS

International Search Report issued in PCT/JP2015/004895; dated Nov. 17, 2015.
(Continued)

Primary Examiner — Asok K Sarkar
Assistant Examiner — Grant S Withers
(74) Attorney, Agent, or Firm — Studebaker & Brackett PC (57) ABSTRACT An imaging apparatus includes a substrate including an imaging element, one or two attachment portions that attach the substrate by screwing and are capable of inclining a board surface of the substrate, by screwing in a screw, relative to a plane perpendicular to an optical axis of an optical system that forms an optical image on the imaging element; and one or more supports configured to abut the substrate from an opposite direction to a screwing direction of the attachment portion at any position, on the substrate, that rotates in the screwing direction of the attachment portion when the board surface is inclined by screwing. As a result, an imaging apparatus that allows an imaging element to be installed at a desired position and orientation while reducing the size of the substrate is provided.

6 Claims, 9 Drawing Sheets (51) Int. Cl.
  G02B 7/00      (2006.01)
  H04N 5/225     (2006.01)
(52) U.S. Cl.
  CPC ..... H01L 27/14625 (2013.01); H04N 5/2253 (2013.01); H04N 5/2254 (2013.01)

(56) References Cited

U.S. PATENT DOCUMENTS

| | | | |
|---|---|---|---|
| 2002/0097453 A1* | 7/2002 | Chen | G02B 7/02 358/509 |
| 2003/0057426 A1 | 3/2003 | Miyazaki et al. | |
| 2010/0059664 A1 | 3/2010 | Aiba | |

FOREIGN PATENT DOCUMENTS

| | | | |
|---|---|---|---|
| JP | 2009-225382 A | 10/2009 | |
| JP | 2010-278678 A | 12/2010 | |

OTHER PUBLICATIONS

Written Opinion issued in PCT/JP2015/004895; dated Nov. 17, 2015; with English language Concise Explanation.
The extended European search report issued by the European Patent Office on Mar. 28, 2018, which corresponds to EP15843598.2-1208 and is related to U.S. Appl. No. 15/514,156.

* cited by examiner

IMAGING APPARATUS

CROSS-REFERENCE TO RELATED APPLICATION

This application claims priority to and the benefit of Japanese Patent Application No. 2014-197530 filed Sep. 26, 2014, the entire contents of which are incorporated herein by reference.

TECHNICAL FIELD

The present disclosure relates to an imaging apparatus that captures an image with an optical system and an imaging element.

BACKGROUND

It is well known that an optical system and an imaging element are widely used by being mounted in a digital camera or video camera. If the position and orientation at which the imaging element is attached is shifted from the desired position and orientation relative to the optical system, the desired image cannot be obtained. Therefore, the imaging element needs to be attached to a high degree of accuracy at the desired position and orientation relative to the optical system. To this end, there are known techniques for attaching an imaging element at a desired position relative to the optical system.

SUMMARY

An imaging apparatus according to one of the disclosed embodiments includes: a substrate including an imaging element; one or two attachment portions that attach the substrate by screwing and are capable of inclining a board surface of the substrate, by screwing in a screw, relative to a plane perpendicular to an optical axis of an optical system that forms an optical image on the imaging element; and one or more supports configured to abut the substrate from an opposite direction to a screwing direction of the attachment portion at any position, on the substrate, that rotates in the screwing direction of the attachment portion when the board surface is inclined by screwing in the screw.

An imaging apparatus according to another embodiment includes: a substrate including an imaging element; one or two attachment portions, to which the substrate is attached by screwing, that are capable of inclining a board surface of the substrate, by screwing in a screw, relative to a plane perpendicular to an optical axis of an optical system that forms an optical image on the imaging element; and one or more supports configured to abut the substrate, when the board surface of the substrate is inclined by screwing in the screw, in a direction against the inclination.

DETAILED DESCRIPTION

A conventional technique and apparatus are for adjusting the position by displacing the imaging element substrate within a plane. This technique cannot adjust the orientation of the imaging element substrate. In one conventional technique, four legs and four or more screws are used to fix the imaging element substrate. By using such a large number of members, however, space for attaching these members to the substrate becomes necessary, which may prevent the imaging element substrate from being made compact.

Therefore, it would be helpful to provide an imaging apparatus that allows an imaging element to be installed at a desired position and orientation while reducing the size of the substrate.

The following describes embodiments of the present disclosure.

Figure 1:
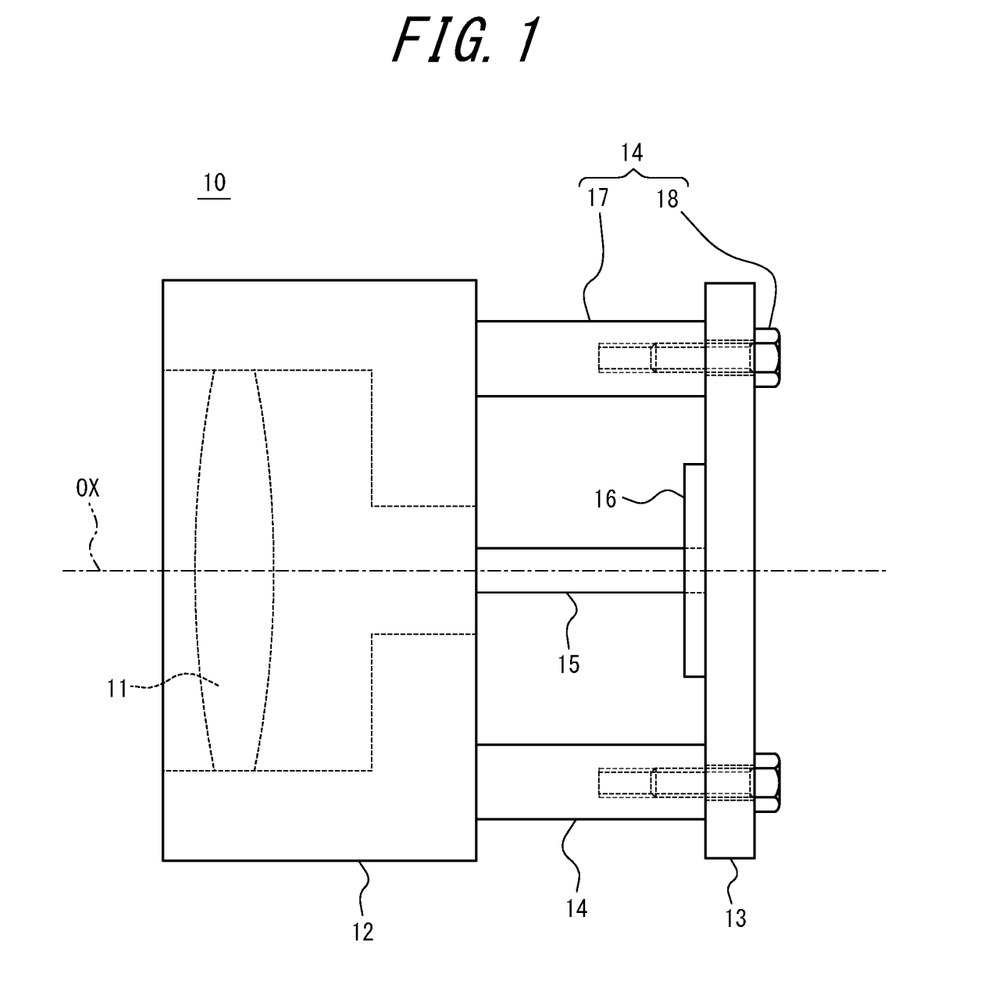
FIG. 1 is a top view of an imaging unit of the imaging apparatus according to Embodiment 1.

An imaging apparatus according to Embodiment 1 is described with reference to FIGS. 1 to 3. As illustrated in FIG. 1, the imaging apparatus includes an imaging unit 10 for capturing an image. The imaging unit 10 includes an optical system 11, a holder 12, a substrate 13, two attachment portions 14, and a support 15.

The optical system 11 has desired optical characteristics by including at least one optical element and forms an optical image of an object.

The holder 12 brings about the aforementioned desired optical characteristics by holding the optical element(s) that form the optical system 11 at a predetermined position and in a predetermined orientation.

The substrate 13 includes an imaging element 16, on which light from the optical system 11 forms an image, so that the light receiving surface of the imaging element 16 and a board surface of the substrate 13 become parallel.

The attachment portions 14 are connected to the holder 12 and attach the substrate 13 to the optical system 11 via the holder 12. The attachment portions 14 may be formed integrally with the holder 12. The attachment portions 14 each include an attachment body 17 and a screw 18. The attachment body 17 is joined to the holder 12. The screw 18 may, for example, be a male screw that can be screwed into a female screw formed inside the attachment body 17. The screw 18 screws the substrate 13 onto the attachment body 17.

Figure 2:
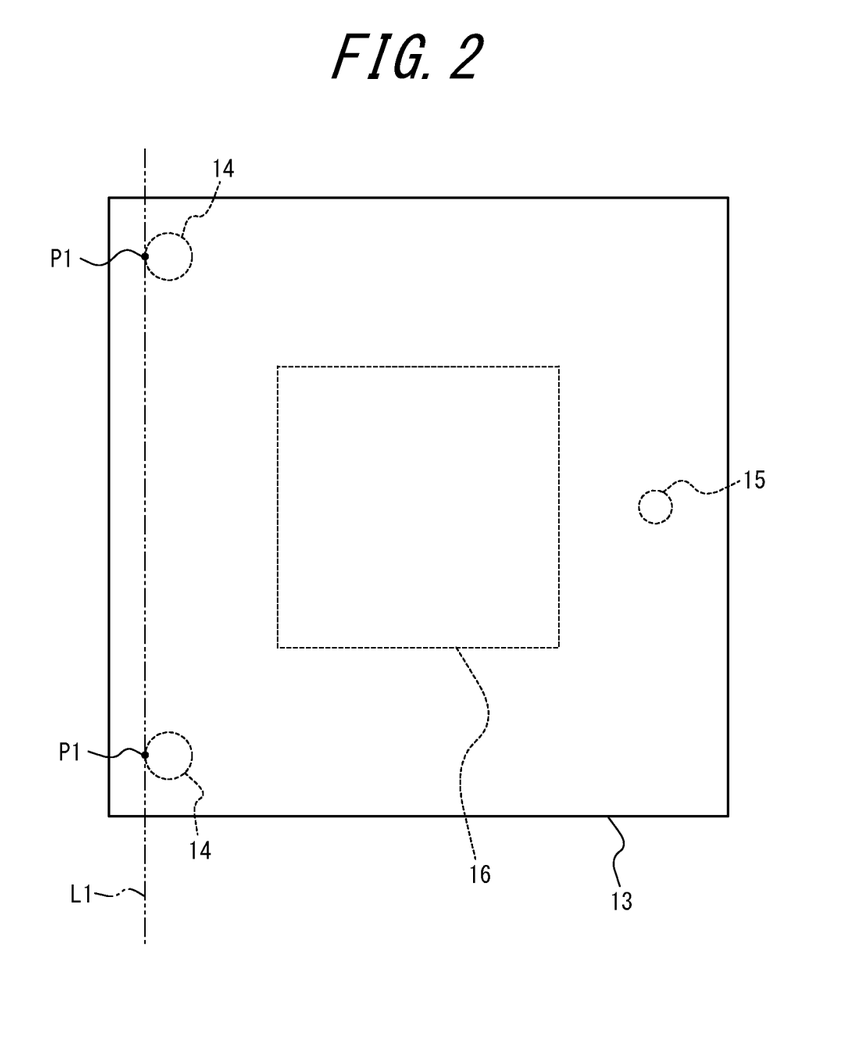
FIG. 2 is a rear view of the imaging unit illustrated in FIG. 1.
Figure 3:
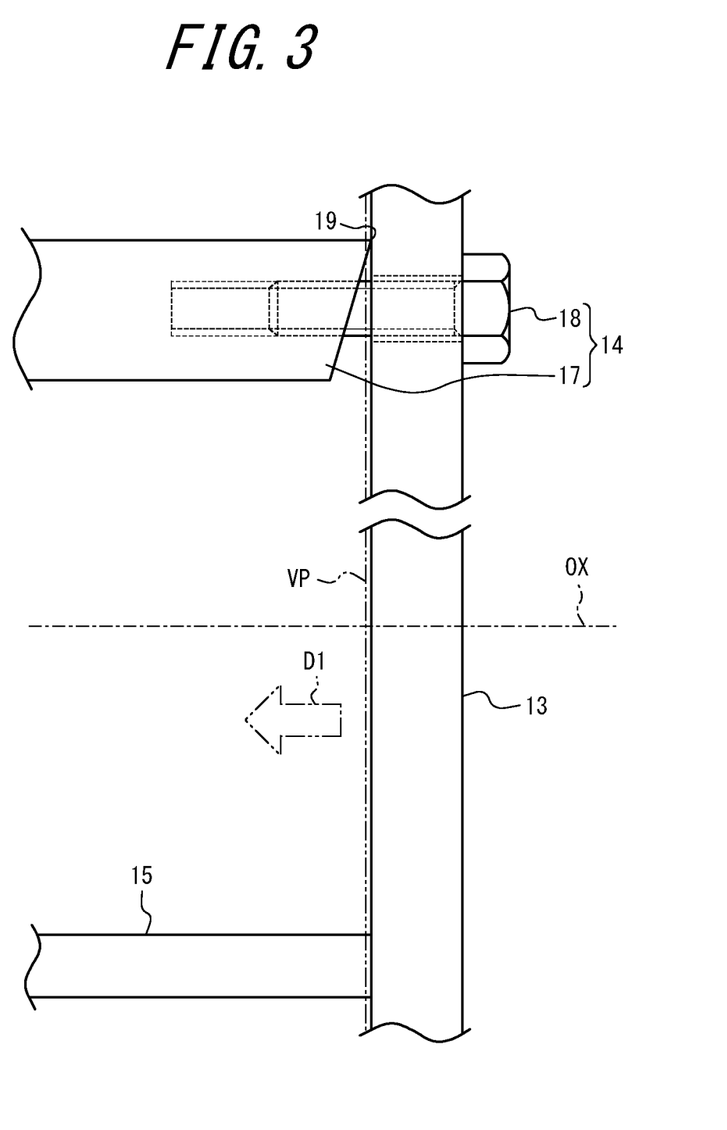
FIG. 3 is an expanded view of an area near the substrate-side end of the attachment portion of the imaging unit illustrated in FIG. 1.

As illustrated in FIG. 2, the attachment portions 14 are formed on the board surface of the substrate 13, at any positions other than the area in which the imaging element 16 is installed, to allow attachment of the board face. Furthermore, in order to attach the substrate 13 stably, the attachment portions 14 are preferably formed to allow attachment at positions along the periphery of the substrate 13.

The attachment portions 14 are formed to be capable of inclining the board surface of the substrate 13, by screwing the screw 18 into the attachment body 17, relative to a plane perpendicular to an optical axis OX of the optical system 11. For example, as illustrated in FIG. 3, in the attachment body 17, an inclined surface is formed on an end on the substrate 13 side along the optical axis OX. The inclined surface is inclined relative to a plane VP perpendicular to the optical axis. Accordingly, upon screwing the screw 18 into the attachment body 17, the substrate 13 abuts a portion 19 of the attachment body 17 positioned furthest on the substrate 13 side, and by screwing the screw 18 further in, the substrate 13 can be inclined from the plane VP perpendicular to the optical axis OX, with the portion 19 as a pivot point. Two attachment portions 14 are formed in this embodiment, but the number of attachment portions 14 may be one or may be three or greater.

The support 15 is joined to the holder 12 and abuts the substrate 13 at a different position on the board surface than the attachment positions of the attachment portions 14 (see FIG. 2). In greater detail, the support 15 abuts the substrate 13 from the opposite direction to a screwing direction D1 of the attachment portion at any position (see FIG. 3), on the board surface of the substrate 13, that rotates in the screwing direction D1 when the substrate 13 is inclined by screwing in the attachment portion 14. That is, the support 15 abuts the substrate 13 from the same direction as the attachment body 17. The support 15 may be formed integrally with the holder 12.

The support 15 abuts the substrate 13 at a position not lying on a line L1 that passes through two contact positions P1, P1 between two attachment bodies 17, 17 and the substrate 13. The two attachment bodies 17, 17 and the support 15 are formed to contact the substrate 13 in the same plane perpendicular to the optical axis OX.

At the position maximizing the moment of the resultant force when the substrate 13 is to be rotated by screwing in the two attachment portions 14, the support 15 may be disposed to abut the substrate 13 from the direction opposite the resultant force. For example, as illustrated in FIG. 2, when two attachment portions 14 are disposed in the periphery of adjacent corners of the substrate 13 that has a square board surface, the support 15 abuts the substrate 13 at a position opposite a position between the two attachment portions 14.

According to the imaging apparatus of Embodiment 1 as described above, by the substrate 13 being inclinable in one direction, the substrate 13 can reliably be inclined towards the support 15, and the moment of the force that, by screwing, rotates the substrate 13 about an axis that is a line perpendicular to the optical axis OX balances the moment of the force by the support 15 that inhibits rotation. Therefore, the substrate 13 can be held stably in a desired orientation. Specifically, the substrate 13 can be held so that the board surface is parallel to the plane VP perpendicular to the optical axis OX.

Furthermore, according to the imaging apparatus of Embodiment 1, the substrate 13 can be attached stably so as to restrict not only displacement within the plane of the substrate 13, but also rotation of the substrate 13 about an axis that is a line perpendicular to the optical axis, while suppressing the number of screws 18 used to configure the imaging unit 10. By suppressing the number of screws 18 attached to the back side of the surface to which the imaging element 16 of the substrate 13 is attached, installation space for installing electronic elements or wiring onto the substrate 13 can be guaranteed. Therefore, the substrate 13 need not be increased in size in order to guarantee space for attaching other components, thereby achieving a reduction in size of the substrate 13.

Figure 4:
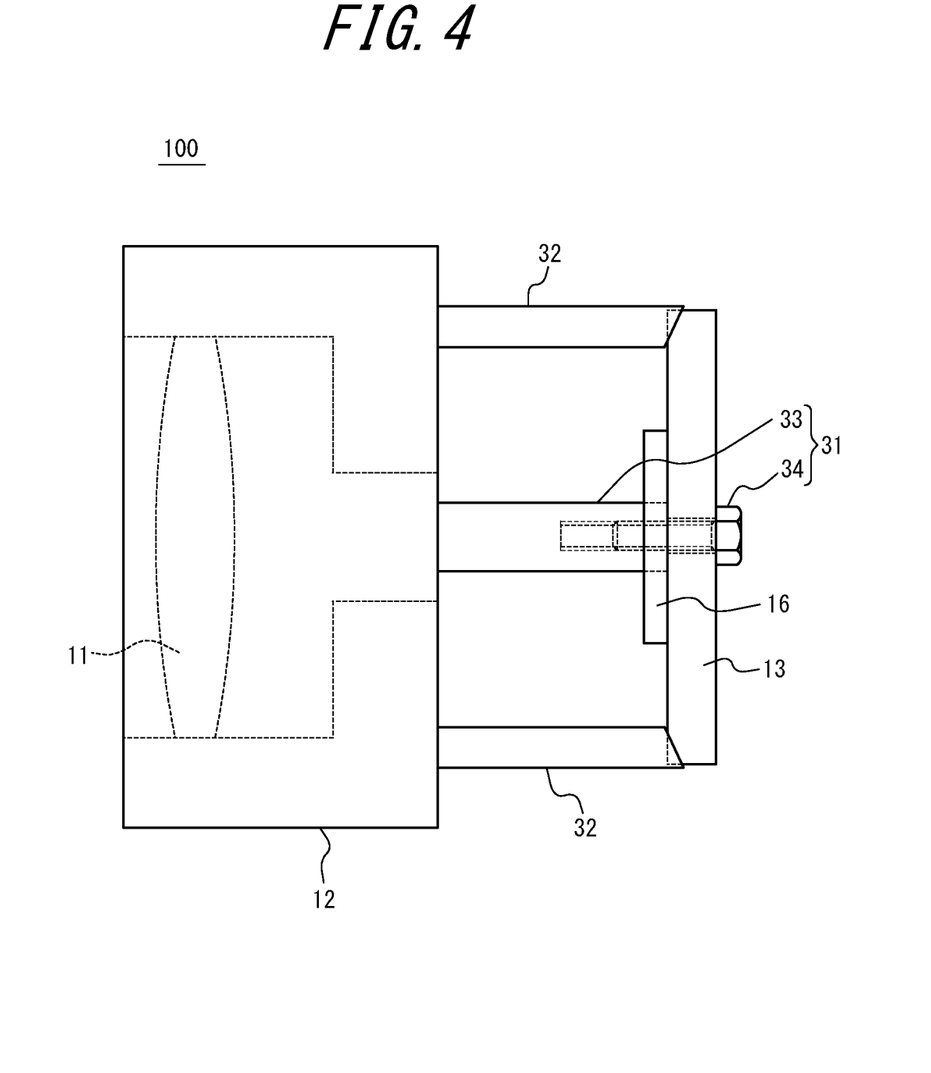
FIG. 4 is a top view of an imaging unit according to Embodiment 2.
Figure 5:
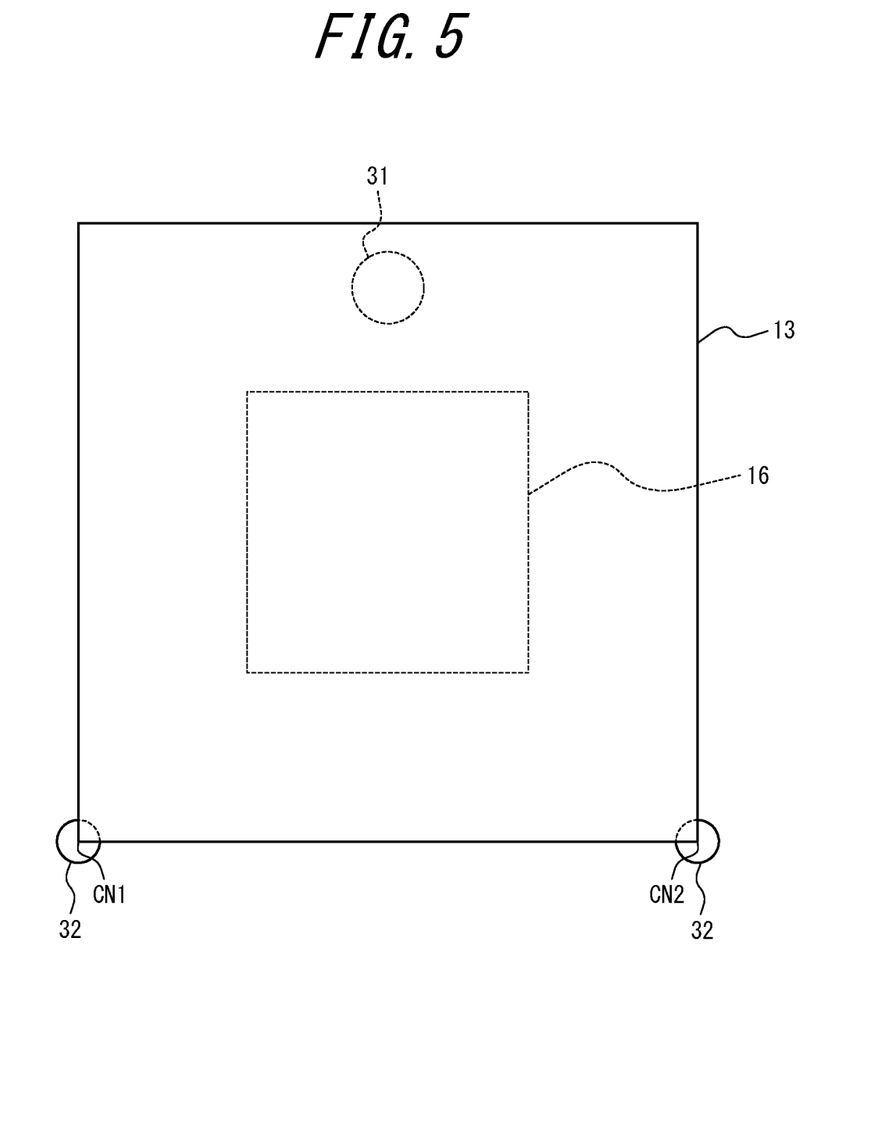
FIG. 5 is a rear view of the imaging unit illustrated in FIG. 4.
Figure 6:
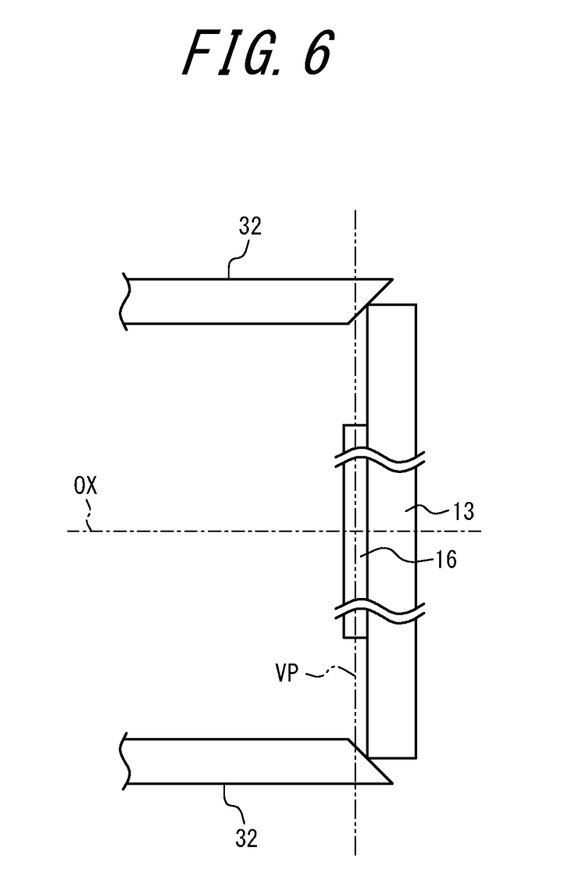
FIG. 6 is an expanded view of an area near the substrate-side ends of the supports in the front view of the imaging unit illustrated in FIG. 5.

Next, with reference to FIGS. 4 to 6, an imaging apparatus according to Embodiment 2 is described. FIG. 4 is a top view, including the optical axis OX, of an imaging unit 100 of the imaging apparatus according to Embodiment 2. The imaging apparatus includes the imaging unit 100 for capturing an image. As illustrated in FIG. 4, the imaging unit 100 includes an optical system 11, a holder 12, a substrate 13, one attachment portion 31, and two supports 32, 32. The optical system 11, holder 12, substrate 13, and imaging element 16 included on the substrate 13 are similar to those of Embodiment 1. Hence, a description thereof is omitted.

The structure and functions of the attachment portion 31 are similar to those of the attachment portions 14 in Embodiment 1. Accordingly, the attachment portion 31 attaches the substrate 13 by screwing and has an inclined face that can incline the substrate 13, by screwing in, relative to the plane VP perpendicular to the optical axis OX.

As illustrated in FIG. 5, the attachment portion 31 is formed on the board surface of the substrate 13, at any position other than the area in which the imaging element 16 is installed, to allow attachment of the substrate 13. Furthermore, in order to attach the substrate 13 stably, the attachment portion 31 is preferably formed to allow attachment at a position along the periphery of the substrate 13. In this embodiment, the attachment portion 31 is formed to allow attachment near the center of any side of the substrate 13, which is rectangular. Any number of attachment portions 31 may be formed at any position.

The supports 32 are joined to the holder 12 and abut the substrate 13 at different positions on the board surface than the attachment position of the attachment portion 31. In greater detail, the supports 32 abut the substrate 13 from the opposite direction to the screwing direction of the attachment portion at any position, on the board surface of the substrate 13, that rotates in the screwing direction when the substrate 13 is inclined by screwing in the attachment portion 31. That is, the supports 32 abut the substrate 13 from the same direction as the attachment body 33. The supports 32 may be formed integrally with the holder 12.

Furthermore, on the board surface of the substrate 13, the two supports 32 abut the substrate 13 at different corners CN1, CN2 on the side opposite the side near the attachment position of the attachment portion 31. Also, the attachment bodies 33 and two supports 32 are formed to contact the substrate 13 in the same plane perpendicular to the optical axis OX.

As illustrated in FIGS. 5 and 6, the supports 32 each have an inclined surface, at the end on the substrate 13 side along the optical axis of the support 32, that is inclined towards the plane VP perpendicular to the optical axis OX. The inclined surfaces of the two supports 32 are at least inclined towards each other, ie. towards the other support 32 (see FIG. 6). Furthermore, the inclined surfaces of the two supports 32 are also preferably inclined towards the attachment portion 31.

The supports 32, 32 may be formed integrally with the holder 12. Also, the imaging apparatus may be provided with three or more supports 32.

According to the imaging apparatus of Embodiment 2 as described above, as in Embodiment 1, the substrate 13 can be held stably in a desired orientation. Specifically, the substrate 13 can be held so that the board surface is parallel to the plane VP perpendicular to the optical axis OX.

Also, according to the imaging apparatus of Embodiment 2, since there is one attachment portion 31, the number of screws 18 used to configure the imaging unit 100 can be kept down to one. In this way, by suppressing the number of screws 18 attached to the back side of the surface to which the imaging element 16 of the substrate 13 is attached, installation space for installing electronic elements or wiring onto the substrate 13 can be guaranteed. Therefore, the substrate 13 need not be increased in size in order to guarantee space for attaching other components, thereby achieving a reduction in size of the substrate 13.

According to the imaging apparatus of Embodiment 2, the end faces on the substrate 13 side of the two supports 32 are at least inclined towards each other, ie. towards the other support 32. Therefore, displacement along the direction of a line connecting the two points of contact can be suppressed, and so can rotation within the plane. Also, according to the imaging apparatus of Embodiment 2, the end faces on the substrate 13 side of the two supports 32 are also inclined towards the attachment portion 31. Therefore, displacement along a direction perpendicular to the two points of contact can be suppressed.

The above embodiments have been described as representative examples, but it will be apparent to one of ordinary skill in the art that numerous modifications and replacements may be made within the spirit and scope of the present disclosure. Therefore, the present disclosure should not be interpreted as being restricted to the above-described embodiments. A variety of changes and modifications may be made without departing from the scope of the appended claims.

Figure 7:
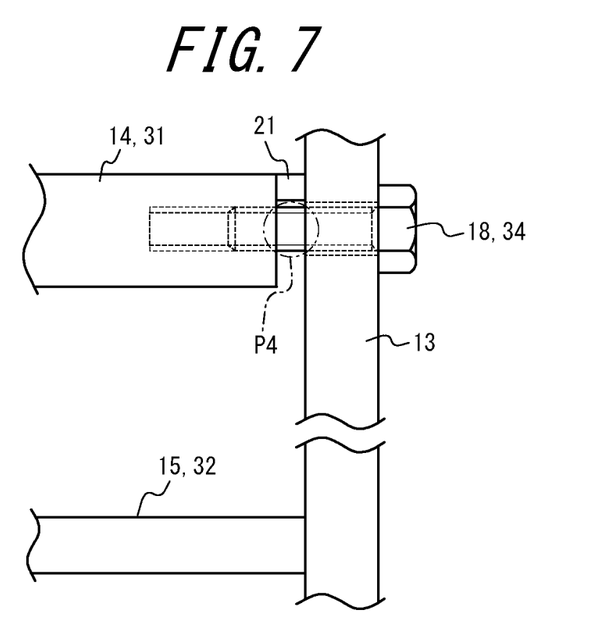
FIG. 7 illustrates a modification to the attachment portion.
Figure 10:
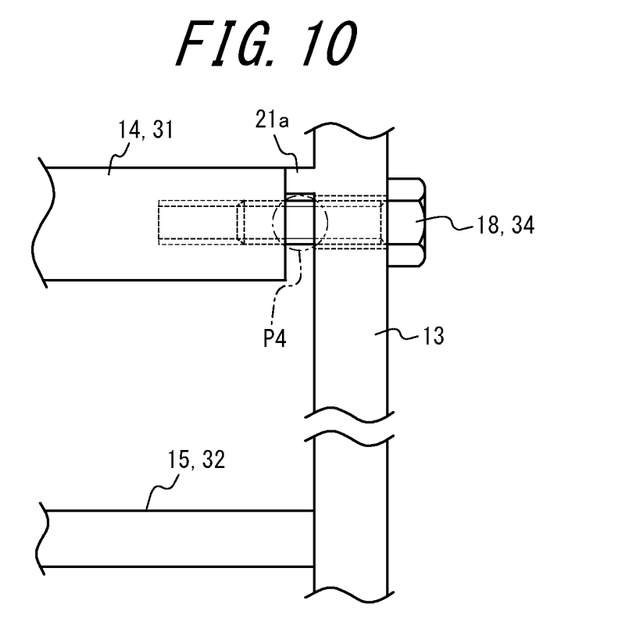
FIG. 10 illustrates a modification to the substrate.
Figure 11:
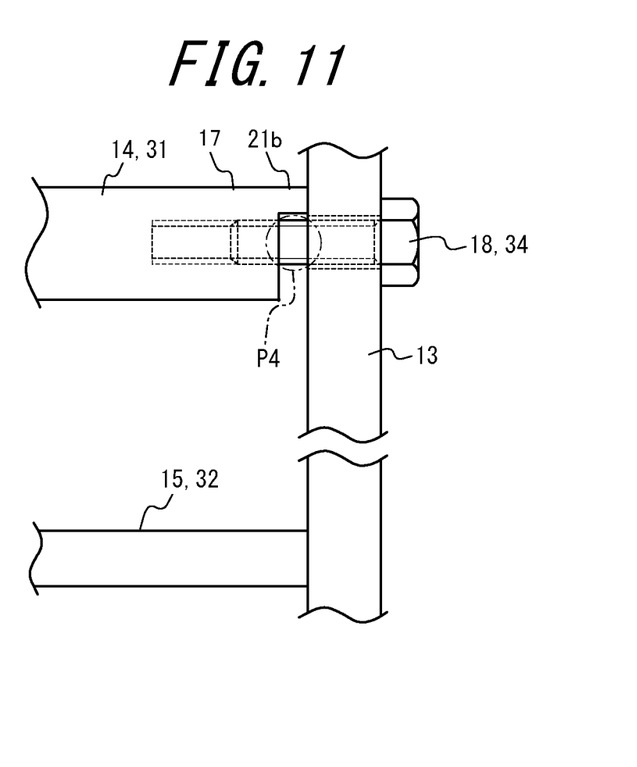
FIG. 11 illustrates a modification to the attachment portion.

In Embodiment 1 and Embodiment 2, by inclining the plane, at the end on the substrate 13 side of the attachment portion 14, 31 along the optical axis OX, relative to the plane VP perpendicular to the optical axis OX, the substrate 13 can be inclined by screwing. The structure for inclining the substrate 13, however, is not limited to such a structure. For example, as illustrated in FIG. 7, the substrate 13 may be inclined by providing a spacer 21 between the attachment portion 14, 31 and the substrate 13 on the opposite side from the support 15, 32 relative to a screwed position P4 of the attachment portion 14, 31. In such a configuration, the end face on the substrate 13 side of the attachment portion 14, 31 along the optical axis OX is not limited to a surface inclined from the plane VP perpendicular to the optical axis OX. As can be seen in FIGS. 10 and 11, spacer 21a can be integrally formed with the substrate 13 and spacer 21b can be integrally formed with the attachment body 17.

Figure 8:
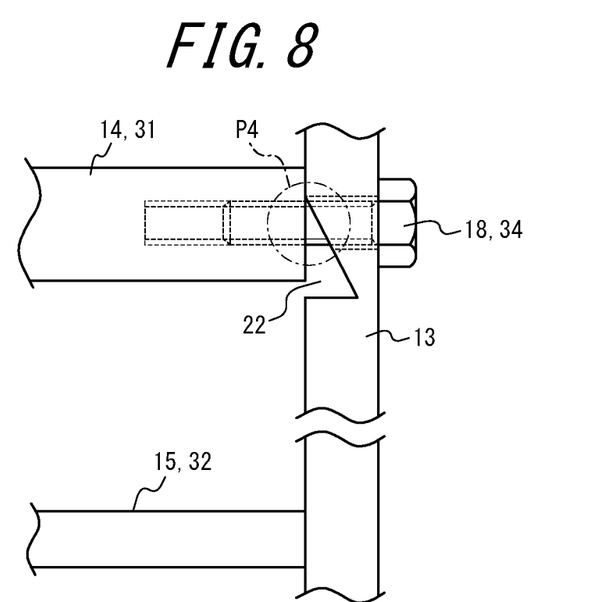
FIG. 8 illustrates a modification to the attachment portion.

Also, for example as illustrated in FIG. 8, an inclined section 22 formed by recessing the board surface of the substrate 13 on the attachment portion 14, 31 side may be provided on the same side as the support 15, 32 relative to the screwed position P4 of the attachment portion 14, 31. The substrate 13 may then be inclined by the inclined section 22 inclining relative to the plane VP perpendicular to the optical axis OX.

Figure 9:
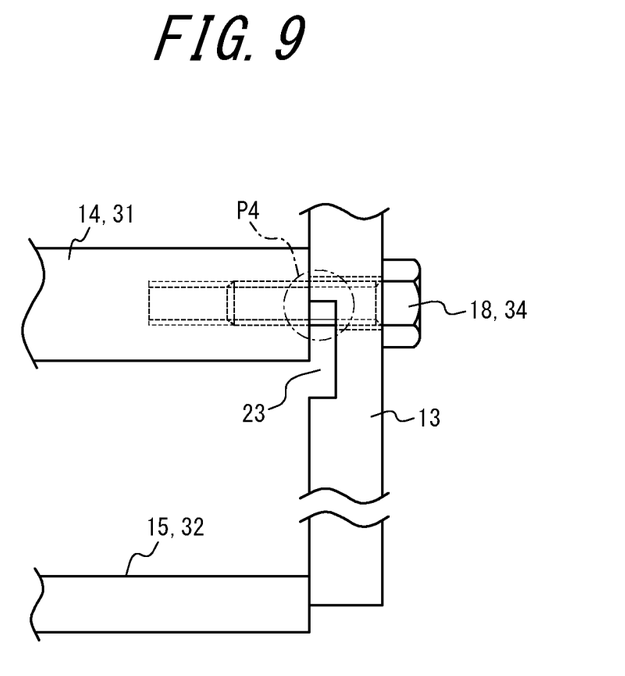
FIG. 9 illustrates a modification to the attachment portion.

For example as illustrated in FIG. 9, a recess 23 may also be provided on the attachment portion 14, 31 side of the substrate 13 at the same side as the support 15, 32 relative to the screwed position P4 of the attachment portion 14, 31. The substrate 13 may then be inclined by the inner surface of the recess 22 being a plane perpendicular to the optical axis OX.

REFERENCE SIGNS LIST

10 Imaging unit
11 Optical system
12 Holder
13 Substrate
14 Attachment portion
15 Support
16 Imaging element
17 Attachment body
18 Screw
21 Spacer
22 Inclined section
23 Recess
31 Attachment portion
32 Support
33 Attachment body
34 Screw
100 Imaging unit
OX Optical axis
CN1 Corner
CN2 Corner
P1 Contact position
P4 Screwed position

The invention claimed is:

1. An imaging apparatus comprising:
   a substrate comprising an imaging element;
   a screw;
   an attachment body, wherein the attachment body is configured to abut the substrate at an attachment position different from a screwed position of the screw to the substrate by being screwed by the screw with the substrate, the attachment body configured to abut the substrate from an opposite direction to a direction the screw is screwed; and
   one or more supports, in a state in which the screw is screwed in the substrate and the attachment body, configured to abut the substrate at an opposite side from the attachment position relative to the screwed position, with the one or more supports configured to abut the substrate from an opposite direction to a direction the screw is screwed in when viewed from a predetermined direction along the substrate.

2. The imaging apparatus comprising two of the attachment bodies;
   wherein the two attachment bodies are capable of rotating the substrate in a same direction.

3. The imaging apparatus comprising a plurality of the supports;
   wherein an end face, on the substrate side of each of the plurality of supports, is inclined towards another support, towards the attachment bodies, or towards a location between another support and the attachment bodies.

4. The imaging apparatus of claim 1, further comprising:
   a holder configured to hold an optical system that forms an optical image on the imaging element;
   wherein the attachment body and the support are formed integrally with the holder.

5. An imaging apparatus comprising:
   a substrate comprising an imaging element;
   a screw;
   an attachment body, wherein the attachment body is configured to abut the substrate at an attachment position different from a screwed position of the screw to the substrate by screwing the screw to the substrate; and
   one or more supports, in a state in which the screw is screwed in the substrate, configured to abut the substrate at an opposite side from the attachment position relative to the screwed position, with the one or more supports configured to abut the substrate from an opposite direction to a direction the screw is screwed in when viewed from a predetermined direction along the substrate;

wherein an end, on the substrate side of the attachment body along an optical axis of an optical system that forms an optical image on the imaging element, is inclined, or is an inclined surface capable of inclining, relative to a plane perpendicular to the optical axis.

6. An imaging apparatus comprising:

a substrate comprising an imaging element;

a screw;

an attachment body, wherein the attachment body is configured to abut the substrate at an attachment position different from a screwed position of the screw to the substrate by screwing the screw to the substrate; and one or more supports, in a state in which the screw is screwed in the substrate, configured to abut the substrate at an opposite side from the attachment position relative to the screwed position, with the one or more supports configured to abut the substrate from an opposite direction to a direction the screw is screwed in when viewed from a predetermined direction along the substrate;

wherein a total count of the attachment bodies and the one or more supports is three or greater; and when a line is drawn through any two of the attachment bodies and the one or more supports, each remaining attachment body and support is provided at a position not lying on the line.

* * * * *